United States Patent [19]

Barre

[11] Patent Number: 5,105,106

[45] Date of Patent: Apr. 14, 1992

[54] CIRCUIT CONFIGURATION FOR CONVERTING TTL-LEVEL SIGNALS INTO CML OR ECL-LEVEL SIGNALS

[75] Inventor: Claude Barre, München, Fed. Rep. of Germany

[73] Assignee: Siemens Aktiengesellschaft, Munich, Fed. Rep. of Germany

[21] Appl. No.: 581,454

[22] Filed: Sep. 11, 1990

[30] Foreign Application Priority Data

Sep. 11, 1989 [EP] European Pat. Off. ........ 89116800.7

[51] Int. Cl.⁵ ............... H03K 19/092; H03K 19/094; H03K 19/086; H03K 19/01
[52] U.S. Cl. .................................. 307/475; 307/446; 307/455; 307/448
[58] Field of Search ............... 307/475, 454, 455, 456, 307/443, 264, 270, 446, 448

[56] References Cited

U.S. PATENT DOCUMENTS

| | | | |
|---|---|---|---|
| 4,453,095 | 6/1984 | Wrathall | 307/475 |
| 4,645,951 | 2/1987 | Uragami | 307/446 |
| 4,943,743 | 7/1990 | Pelley, III et al. | 307/475 |
| 4,994,691 | 2/1991 | Naghshineh | 307/475 |
| 5,008,570 | 4/1991 | Coddington | 307/475 |
| 5,013,941 | 5/1991 | Jansson | 307/475 |

FOREIGN PATENT DOCUMENTS

| | | | |
|---|---|---|---|
| 0132148 | 1/1985 | European Pat. Off. | 307/475 |
| 0200230 | 11/1986 | European Pat. Off. | 307/475 |
| 0232969 | 8/1987 | European Pat. Off. | 307/475 |
| 0326947 | 8/1989 | European Pat. Off. | 307/446 |

OTHER PUBLICATIONS

Publication "The Integrated Circuits Catalog for Design Engineers", published by Texas Instruments in 1972, 3 pages.
IBM Technical Disclosure Bulletin, vol. 21, No. 7 Dec. 1978, Clemen et al: "$V_T$-Compensated TTL-Compatible MOS Amplifier".

Primary Examiner—Edward P. Westin
Assistant Examiner—David R. Bertelson
Attorney, Agent, or Firm—Herbert L. Lerner; Laurence A. Greenberg

[57] ABSTRACT

A circuit configuration includes first, second and third current impressing devices. First and second bipolar transistors have coupled emitter terminals being connected through the first current impressing device to a first potential, collector terminals carrying output signals and being connected directly or through respective resistors to a second potential, and base terminals. A first field effect transistor has a gate terminal being acted upon by a first input signal, a drain terminal being connected through a further resistor to the second potential, and a source terminal being connected to the base terminal of the first bipolar transistor and through the second current impressing device to the first potential. A second field effect transistor has a gate terminal being acted upon by a reference potential, a drain terminal being connected through another resistor to the second potential, and a source terminal being connected to the base terminal of the second bipolar transistor and through the third current impressing device to the first potential.

3 Claims, 1 Drawing Sheet

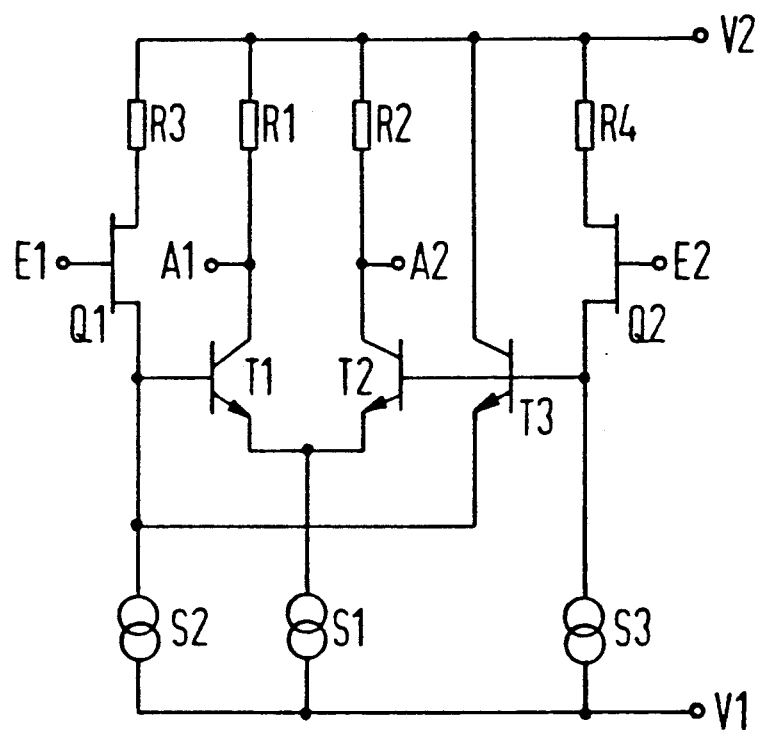

CIRCUIT CONFIGURATION FOR CONVERTING TTL-LEVEL SIGNALS INTO CML OR ECL-LEVEL SIGNALS

BACKGROUND OF THE INVENTION

Field of the Invention

The invention relates to a circuit configuration for converting TTL-level signals into CML or ECL-level signals.

In numerous applications, there is a need to supply signals from circuits in transistor-transistor logic (TTL) to circuits in current-mode logic (CML) or to circuits in emittercoupled logic (ECL). However, such a signal supply is not readily performed because the signal levels of the various circuit types are different. The greatest differences arise between the TTL level and the CML or ECL level, while the CML and ECL levels are more like one another. This can be easily explained in terms of the voltage ranges necessary for the particular logic state. The voltage equivalent to the L state is between $-1.2$ V and $+0.8$ V in TTL, it is approximately $-0.5$ V in CML, and it is approximately $-1.3$ V in ECL. The voltage equivalent to the H state is between $+2.0$ V and $+5.5$ V in TTL, it is approximately equal to 0 V in CML, and it is approximately $-0.8$ V in ECL. Special circuit configurations are therefore required in order to adapt the very different levels to one another.

DESCRIPTION OF THE RELATED ART

The Integrated Circuit Catalog for Design Engineers, 1st edition, published by Texas Instruments in 1972, pages 4-74 and 4-83, discloses a circuit configuration for converting TTL-level signals into ECL-level signals. However, the expense for circuitry and the associated power consumption for that configuration are relatively high.

SUMMARY OF THE INVENTION

It is accordingly an object of the invention to provide a circuit configuration for converting TTL-level signals to ECL-level or CML-level signals, which overcomes the hereinafore-mentioned disadvantages of the heretofore-known devices of this general type and to do so with less expense for circuitry.

With the foregoing and other objects in view there is provided, in accordance with the invention, a circuit configuration, comprising first, second and third current impressing means; first and second bipolar transistors having coupled emitter terminals being connected through the first current impressing means to a first potential, collector terminals carrying output signals and being connected directly or through respective resistors to a second potential, and base terminals; a resistor; a first field effect transistor having a gate terminal being acted upon by a first input signal, a drain terminal being connected through the resistor to the second potential, and a source terminal being connected to the base terminal of the first bipolar transistor and through the second current impressing means to the first potential; another resistor; and a second field effect transistor having a gate terminal being acted upon by a reference potential, a drain terminal being connected through the other resistor to the second potential, and a source terminal being connected to the base terminal of the second bipolar transistor and through the third current impressing means to the first potential.

In accordance with a concomitant feature of the invention, there is provided a third bipolar transistor having a collector terminal being connected to the second potential, a base terminal being connected to the base terminal of the second bipolar transistor, and an emitter terminal being connected to the base terminal of the first bipolar transistor.

The advantages of the invention are the steep transfer curve in the input level range, the short transit times at low power loss, and the avoidance of saturation of the transistors over the entire input level range.

Other features which are considered as characteristic for the invention are set forth in the appended claims.

Although the invention is illustrated and described herein as embodied in a circuit configuration for converting TTL-level signals into CML or ECL-level signals, it is nevertheless not intended to be limited to the details shown, since various modifications and structural changes may be made therein without departing from the spirit of the invention an within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The drawing is a schematic circuit diagram of an exemplary embodiment of a circuit according to the invention.

DESCRIPTION OF THE PREFERRED EMBODIMENT

Referring now to the single figure of the drawing in detail, there is seen a transistor pair with first and second bipolar transistors T1, T2 of the n-p-n type, having coupled emitter terminals which are connected through first current impressing means S1 to a negative first potential V1, and collector terminals which are each connected through a respective first or second resistor R1, R2 to a positive second potential V2. Optionally, the resistors R1, R2 may be replaced with line bridges or jumper links. Output signals A1, A2 are likewise picked up at the collector terminals of the first and second bipolar transistors T1, T2. The base of the first bipolar transistor T1 is connected through second current impressing means S2 to the first potential V1 and it is also connected to the source terminal of a first MOS field effect transistor Q1 of the n-channel type. The gate terminal of the first field effect transistor Q1 in turn is acted upon by a first input signal E1 and the drain terminal thereof is acted upon by the second potential V2 through a third resistor R3. In the same manner, the base of the second bipolar transistor T2 is connected to the first potential V1 through third current impressing means S3 and it is also connected to the source terminal of a second MOS field effect transistor Q2 of the n-channel type. A reference potential E2 is applied to the gate terminal of the second field effect transistor Q2, and the second potential V2 is applied to the drain terminal thereof through a fourth resistor R4. If the resistors R1 and R2 are dispensed with, only the resistors R3 and R4 are provided.

According to an embodiment of the invention, a third bipolar transistor T3 of the n-p-n type is provided. The base of the third bipolar transistor T3 is wired to the base of the second bipolar transistor T2 and the emitter thereof is wired to the base of the first bipolar transistor T1. The collector of the third bipolar transistor T3 is acted upon by the second potential V2. The advantage of this structure is a reduced dependency on the dimensioning of the other elements.

Further embodiments of the circuit configuration according to the invention are obtained, for instance, by replacing some current sources, MOS current sources, or ohmic resistors. In the last two options, the third bipolar transistor T3 can be dispensed with in principle. Moreover, types of dimensioning in which the third and fourth resistors R3, R4 can be dispensed with are also possible. Furthermore, the adaptation of the output level to ECL levels or CML levels is effected through the dimensioning of the various structural components.

I claim:

1. Signal level converter for converting TTL input signals with a given voltage swing into output signals with a relatively smaller voltage swing, comprising first, second and third current impressing means; first and second resistors; first and second bipolar transistors having coupled emitter terminals being connected through said first current impressing means to a first potential, collector terminals carrying output signals and each being connected through a respective one of said first and second resistors to a second potential, and base terminals; a first field effect transistor having a gate terminal being acted upon by an input signal, a drain terminal being connected to the second potential, and a source terminal being connected to the base terminal of said first bipolar transistor and through said second current impressing means to the first potential; and a second field effect transistor having a gate terminal being acted upon by a reference potential, a drain terminal being connected to the second potential, and a source terminal being connected to the base terminal of said second bipolar transistor and through said third current impressing means to the first potential.

2. Signal level converter according to claim 1, including a third bipolar transistor having a collector terminal being connected to the second potential, a base terminal being connected to the base terminal of said second bipolar transistor, and an emitter terminal being connected to the base terminal of said first bipolar transistor.

3. Signal level converter according to claim 1, including third and fourth resistors each being connected between a respective one of said drain terminals of said first and second field effect transistors and the second potential.

* * * * *